United States Patent [19]
Kajitani et al.

[11] Patent Number: 5,688,410
[45] Date of Patent: Nov. 18, 1997

[54] METHOD OF ASHING RESIST AND APPARATUS THEREFOR

[75] Inventors: Masaru Kajitani, Osaka; Satoshi Yabuta, Taki-gun; Katsuhiro Kawai, Yamatotakada; Masaya Okamoto, Soraku-gun, all of Japan

[73] Assignee: Sharp Kabushiki Kaisha, Osaka, Japan

[21] Appl. No.: 581,197

[22] Filed: Dec. 29, 1995

[30] Foreign Application Priority Data

Dec. 29, 1994 [JP] Japan .................. 6-340093

[51] Int. Cl.$^6$ .................. C23F 1/00; H01L 21/306
[52] U.S. Cl. .................. 216/64; 216/67; 156/643.1; 156/659.11; 156/345
[58] Field of Search .................. 216/64, 67, 71; 156/646.1, 345

[56] References Cited

U.S. PATENT DOCUMENTS

| | | | |
|---|---|---|---|
| 5,047,115 | 9/1991 | Charlet et al. | 156/643 |
| 5,057,187 | 10/1991 | Shinagawa et al. | 156/643 |
| 5,298,112 | 3/1994 | Hayasaka et al. | 156/643 |
| 5,536,364 | 7/1996 | Yoshida et al. | 156/643.1 |

FOREIGN PATENT DOCUMENTS

| | | | |
|---|---|---|---|
| 1112733 | 5/1989 | Japan | H01L 21/302 |
| 2102528 | 4/1990 | Japan | H01L 21/302 |

OTHER PUBLICATIONS

"A Plasma Oxidation ... Photoresist Films", by S.M. Irving, *Solid State Technology*, Jun. 1971, vol. 14, pp. 47–51.

*Primary Examiner*—R. Bruce Breneman
*Assistant Examiner*—Michael E. Adjodha
*Attorney, Agent, or Firm*—Birch, Stewart, Kolasch & Birch, LLP

[57] ABSTRACT

An object of the invention is to enhance the ashing speed of resist. A parallel plate electrode type plasma etching device is used in a mixed gas atmosphere of $SF_6$ gas and $O_2$ gas with the concentration of $SF_6$ gas defined within 5 vol. % to 15 vol. %. A substrate to be treated, coated with a resist of hydrocarbon polymer is placed on a lower electrode. A high frequency electric power is applied to an upper electrode and lower electrode placed parallel to each other, and a plasma of mixed gas is generated in the reactor. A chemical reaction is induced in the resist and active ions of the plasma to vaporize and remove the resist.

3 Claims, 7 Drawing Sheets

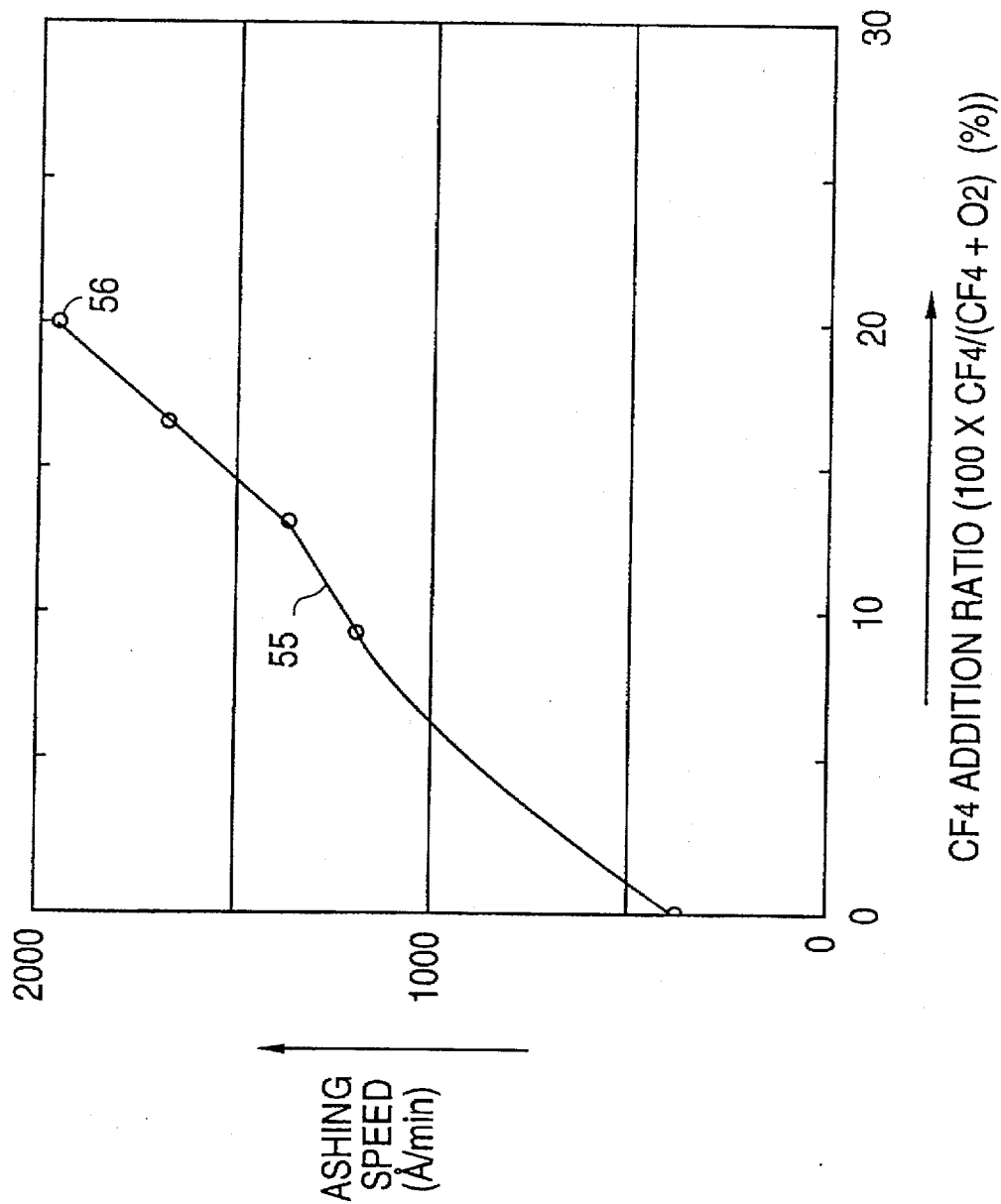

METHOD OF ASHING RESIST AND APPARATUS THEREFOR

BACKGROUND OF THE INVENTION

1. Field of the Invention

The present invention relates to method of ashing a resist used in the manufacture of semiconductor devices, electronic devices, and others as well as to an apparatus therefor.

2. Description of the Related Art

In a manufacturing process of semiconductor elements, forming and processing of films are repeated plural times. First, an insulator film, semiconductor film, conductor film and others are formed on a substrate by a sputtering method, plasma CVD (chemical vapor deposition) method or the like. A photo resist is applied to these films, and a mask copying a wiring pattern or the like is overlaid, and they are exposed to light. Then, by developing the photo resist, an etching mask is formed. Consequently, the portion of the films not covered with the etching mask is removed by dry etching or other methods, and wiring pattern and others are formed. Finally, by removing the photo resist, processing of films is terminated. By repeating such formation and processing of films several times, a semiconductor element is formed.

Conventionally, a wet method is applied in the removal of a photo resist. The wet method is a method of immersing a substrate to be treated, on which an etching mask is formed by a photo resist, in a releasing liquid for releasing the photo resist, and peeling off the photo resist by applying vibration or the like to the substrate to be treated. The substrate passing through plural releasing liquid baths is cleaned while passing through a rinsing bath, purified water washing bath, isopropyl alcohol vapor drying bath, and others. To improve the degree of cleanliness, each of the releasing liquid bath, rinsing bath, purified water washing bath and others is composed of a plurality of cells such as two or three. Depending on the type of baths, processing such as vibration of a substrate and application of ultrasonic wave is carried out. Thus, the wet method requires a long cleaning process aside from the releasing process.

In the solution after treating numerous substrates, insoluble matters such as released photo resists are accumulated. The solution may be also contaminated by impurities depositing on the substrates and others. Accordingly, the solution in the bath must be changed after treatment of every specific number of substrates, for example, several hundred pieces. Solutions in the releasing liquid bath and rinsing bath contain harmful substances such as dimethyl sulfoxide, dimethyl formamide, isopropyl amine, and others as principal ingredients. To discard these solutions, therefore, chemical treatment for making them harmless is required. In this way, the wet method requires much labor in the disposal of solutions, carries a relatively large volume of solutions to be treated, and hence, requires a wide area for the installation of equipments.

A dry method of removing a photo resist without using solution includes, for example, an ashing method. The ashing method is a method of removing the photo resist by ashing with oxygen plasma, by performing the plasma etching method employed in the etching process in an oxygen atmosphere. In the plasma etching method, the substrate to be treated and etching gas are sealed in a container interposed between a pair of electrodes. By applying high frequency electric power to the electrodes, plasma of etching gas is generated in the container. By reaction between active ions in the plasma and the substance on the substrate surface, the photo resist is vaporized, and removed. This method of using oxygen plasma was developed by S. M. Irving, and is described in "Solid State Technology, Vol. 14 (June 1971) 47."

Such dry method does not require a cleaning process. Besides, since the ashed photo resist is vaporized, reaction products such as vaporized photo resists can be removed by a simple removal device attached to an exhaust tube for exhausting the gas in the container or the like. These reaction products are accumulated in a container provided in the removal device.

To discard the reaction products removed and accumulated in the container, chemical treatment for making the products harmless is required, but the number of processes is smaller as compared with the wet method which requires treatment of solutions aside from reaction products. Besides, to discard the products, in the wet method, solutions in plural baths are removed, and fresh solutions must be poured into baths, whereas in the dry method it is only required to replace the container for accumulating the reaction products provided in the removal device. In the dry method, thus, the reaction products can be discarded easily.

Other prior art of ashing method of photo resist is disclosed in Japanese Unexamined Patent Publication 1-112733 (1989). In this art, a down-flow type plasma etching device is used in a mixed gas atmosphere of oxygen, nitrogen and $CF_4$. Hence, without having to heat the substrate, the time required for ashing is shorter than in the case of using gas added with nitrogen or $CF_4$ individually to oxygen.

Another prior art is disclosed in Japanese Unexamined Patent Publication 2-102528 (1990). In this art, a plasma etching device of parallel plate electrode type is used in a mixed gas atmosphere of oxygen, ozone, and fluorocarbon. As a result, in the semiconductor element manufacturing process, the photo resist degenerated by ion injection treatment can be removed by high frequency electric power of low output at a high ashing speed.

In the semiconductor manufacturing process, as mentioned above, forming and processing of films are repeated plural times. Therefore, the removal process of photo resist is also carried out plural times. For performing the semiconductor manufacturing process promptly, it needs to shorten the time required for the ashing process.

In the ashing method to be conducted in the oxygen gas atmosphere which is in the mainstream in the present technology, the ashing speed, that is, the speed of removing the photo resist is slow. Therefore, the ashing time is long, and the manufacturing throughput is low. Accordingly, in the manufacturing process, multiple ashing devices are needed to treat many substrates within a short time.

As a method of increasing the ashing speed, a method of increasing the high frequency electric power applied to the electrodes may be considered, but as the electric power increases, charged particles of high energy increase in the plasma in the reactor. The charged particles may damage the surface layer of the substrate being treated, for example, by etching other parts than the photo resist. Other methods of increasing the etching speed include a method of increasing the temperature of the substrate to be treated, but when the substrate temperature is raised in the oxygen atmosphere, the substrate surface is likely to be oxidized. As a result, the substrate surface layer is oxidized and the electric properties of the semiconductor are changed.

SUMMARY OF THE INVENTION

It is hence an object of this invention to provide a method of ashing a resist which increases the ashing speed as compared to the conventional ashing speed and an apparatus therefor.

To achieve the object, the invention provides a method of ashing a resist, characterized by installing a substrate to be treated on which a resist is applied, in a mixed gas atmosphere comprising $SF_6$ gas and $O_2$ gas, with the concentration of $SF_6$ gas selected to be in a range of 5 vol. % to 15 vol. %, and by generating a plasma of the mixed gas, thereby ashing the resist.

The resist of the invention is selected from a polymer material of hydrocarbon.

It is preferable in the invention that the concentration of the $SF_6$ gas in the mixed gas is selected to be 7.0 vol. %.

Further it is preferable in the invention that the substrate to be treated is mounted on a first electrode provided inside a reactor, the mixed gas is introduced into the reactor and the internal pressure of the reactor is maintained at 500 mTorr, the first electrode is heated at 60° C., the high frequency electric power having a frequency of 13.56 MHz and power per unit area of 0.10 $W/cm^2$ is applied to a second electrode which faces the first electrode at least with the substrate to be treated between in order for discharge to occur, and the mixed gas is ionized by the discharge to form plasma.

The invention provides an apparatus for ashing a resist wherein the resist coating a substrate to be treated is ashed by plasma, said apparatus comprising:

a first planar electrode on which the substrate to be treated is mounted;

a second planar electrode disposed at the substrate-mounting surface side of the first electrode, the second electrode opposing the first electrode;

power supplying means for supplying the first electrode and the second electrode with predetermined power;

heating means for heating the substrate to be treated which is mounted on the first electrode;

a reactor for containing and sealing at least the first electrode, the second electrode and the substrate to be treated; and reacting-gas supplying means for supplying the reactor with a mixed gas which contains $O_2$ gas and $SF_6$ gas with the $SF_6$ gas being present at from 5 to 15 vol. % in concentration.

According to the invention, the substrate to be treated on which a resist is applied is installed in a mixed gas atmosphere of $SF_6$ gas and $O_2$ gas. The resist is ashed by inducing a chemical reaction between the resist and the active components in the plasma of mixed gas generated by applying high frequency electric field to the mixed gas.

The mixed gas is adjusted so that the $SF_6$ gas concentration may be in a range of 5 vol. % to 15 vol. %. When the $SF_6$ gas concentration of the mixed gas is increased from 0 vol. %, the ashing speed also increases. When the concentration is increased over 15 vol. %, the ashing speed decreases to the contrary. For example, to remove the resist applied on an entire surface of a rectangular substrate of about 360 mm×465 mm, the variance of ashing speed in each region obtained by dividing the substrate into small divisions is as small as permitted in the actual manufacturing process when the $SF_6$ gas concentration in the mixed gas is in a range of 5 vol. % to 15 vol. %. Hence, when the $SF_6$ concentration in the mixed gas is defined within 5 vol. % to 15 vol. %, uniform ashing progresses in a single substrate, and the ashing speed is increased as compared with that of the ashing process by $O_2$ gas alone.

According to the invention, the material of the resist to be ashed in the invention is preferred to be a hydrocarbon polymer.

Further according to the invention, when performing the ashing process, the concentration of $SF_6$ in the mixed gas of $SF_6$ gas and $O_2$ gas is preferred to be selected at 7.0 vol. %. When performing the ashing process by using a mixed gas of $SF_6$ gas and $O_2$ gas, the ashing speed for ashing the resist increases suddenly when the $SF_6$ gas addition ratio in the mixed gas is increased, and reaches a maximum value when the $SF_6$ gas concentration is 7.0 vol. %. Hence, the time required for ashing process is made shortest when using a mixed gas of which $SF_6$ gas concentration is 7.0 vol. %.

Moreover, according to the invention, the substrate to be treated is positioned on the first electrode in a reactor. The reactor is sealed tightly after placing the substrate to be treated, and after the internal gas has been exhausted, a mixed gas of $SF_6$ gas and $O_2$ gas with $SF_6$ gas concentration ranging from 5 vol. % to 15 vol. % is introduced, and this mixed gas atmosphere is maintained. The internal pressure in the reactor after introducing the mixed gas is kept at 500 mTorr.

The mixed gas fed into the reactor is ionized by electric discharge taking place between the first and second electrodes confronting each other at least on both sides of the substrate to be treated. As a result, a plasma of mixed gas is generated. For instance, the first electrode is grounded. The high frequency electric power applied to the second electrode has a frequency of 13.56 MHz, and its electric power per unit area is 0.10 $W/cm^2$.

For example, when the $SF_6$ concentration of the mixed gas is 7.0 vol. %, the ashing speed of the ashing process conducted under these conditions is about 5200 angstroms/min. In the case of an ashing process by $O_2$ gas alone, to obtain an ashing speed equal to this ashing speed, the high frequency electric power must be increased to 2.0 $W/cm^2$ per unit area. Hence, in an ashing process according to the conditions of the invention, as compared with an ashing process at the same speed by using $O_2$ gas alone, the high frequency electric power applied to the electrodes may be lowered to about 1/20.

Also, the substrate to be treated is heated to 60° C. The heating temperature of the substrate to be treated is lower as compared with temperatures in the ashing by using plasma of $O_2$ gas alone of the prior art. Hence, oxidation and thermal damage of the substrate surface can be decreased.

Also according to the invention, the ashing device of the resist ashes the resist applied on the substrate by the plasma of mixed gas of $SF_6$ gas and $O_2$ gas. This ashing device is a so-called parallel plate type plasma etching device.

In the reactor, a first and a second electrode composed of flat plate members are disposed parallel confronting each other. The substrate to be treated is placed, for example, at the side confronting the second electrode, which is the upper side of the first electrode disposed at the lower side in the vertical direction of a container. When the substrate is placed in the reactor, the reactor is sealed, and the internal gas is exhausted. When the inside of the reactor is evacuated to a predetermined degree of vacuum, the mixing gas feeding means feeds the mixed gas into the reactor.

The reactor keeps the pressure of the mixed gas lower than the atmospheric pressure, and maintains the mixed gas atmosphere in a predetermined state. The mixed gas contains $SF_6$ gas and $O_2$ gas, and the concentration of $SF_6$ gas is selected at 5 vol. % to 15 vol. %. The mixed gas feeding means controls, for example, the flow rate of $SF_6$ gas and flow rate of $O_2$ gas flowing into the reactor, and keeps the $SF_6$ addition ratio in the mixed gas at a desired ratio.

The reactor may also incorporate heating means for heating the substrate to be treated. The heating means heats the first electrode placed, for example, in the reactor, and the heat is transmitted to the substrate to be treated from the part contacting the heated first electrode. As a result, the substrate to be treated is heated.

The mixed gas between the first and second electrodes is ionized in the high frequency electric field formed between the electrodes. For example, the first electrode is grounded, and predetermined high frequency electric power is applied to the second electrode from the electric power feeding means. As a result, electric discharge takes place between the first and second electrodes, and atoms and molecules of the mixed gas are ionized by this electric discharge, thereby generating plasma of the mixed gas. The resist chemically reacts with active ions and others in this plasma, and is vaporized.

Using such device, the resist can be ashed and removed.

In this method, the ashing speed can be increased as compared with the case of ashing the resist by using a plasma of oxygen gas alone.

Thus, according to the invention, the resist applied on the substrate to be treated which is realized by, for example, a hydrocarbon polymer is ashed by plasma of mixed gas of $SF_6$ gas and $O_2$ gas with the $SF_6$ gas concentration ranging from 5 vol. % to 15 vol. %. As a result, the ashing speed is faster than that in the case of using plasma of $O_2$ alone, and hence the time required for ashing process is curtailed. Therefore, the throughput of the apparatus is notably increased. Moreover, as compared with the wet ashing process, the removed reaction products can be discarded easily, and the manufacturing cost can be hence decreased. Still more, it is not necessary to raise the high frequency electric power to be applied to the electrodes in order to increase the ashing speed.

When ashing by using the mixed gas, the high frequency electric power to be applied to the electrodes can be suppressed to a low output as compared with the case of ashing at the same ashing speed as in the conditions above by using the plasma of $O_2$ gas alone. Hence, the number of high energy charged particles in the plasma decreases, and damage of surface of the substrate to be treated by high energy charged particles can be prevented. Besides, it is not necessary to raise the temperature of the substrate to be treated in order to increase the ashing speed, and the substrate temperature may be kept low. Hence, the oxidation and thermal damage of the substrate surface can be decreased. Therefore, the damage of the substrate to be treated can be prevented.

Also according to the invention, the resist is ashed by plasma of mixed gas of $SF_6$ gas and $O_2$ gas with the $SF_6$ gas concentration at 7.0 vol. %. When ashed by using the mixed gas of such concentration, the ashing speed is the fastest when ashed by using a mixed gas of $SF_6$ gas and $O_2$ gas of which $SF_6$ gas concentration ranges from 5 vol. % to 15 vol. %. Hence, the time required for ashing process becomes the shortest.

Further according to the invention, in this ashing process, the substrate coated with resist is placed on the electrode in the reactor of which internal pressure is reduced to 500 mTorr in a mixed gas atmosphere of $SF_6$ gas and $O_2$ gas. This electrode is heated to 60° C., which in turn heats the substrate. The mixed gas sealed in the reactor is ionized by an electric discharge from the electrode applied with high frequency electric power of which frequency is 13.56 MHz and electric power per unit area is 0.10 W/cm². The resist is ashed by the plasma of the ionized mixed gas.

Thus, when ashing process is executed by using the mixed gas of $SF_6$ gas and $O_2$ gas, as compared with the ashing process at the same speed by using $O_2$ gas alone, the high frequency electric power applied to the electrodes, and the heating temperature of the substrate to be heated are substantially lowered, and therefore inconvenience such as damage and oxidation of the surface of the substrate to be treated can be minimized.

Also according to the invention, the substrate coated with resist is ashed by the plasma of mixed gas of $SF_6$ gas and $O_2$ gas, by using the so-called parallel plate type plasma etching device. In this way, by using the device generally used in drying etching process, the invention can be realized. Hence it is easy to execute.

BRIEF DESCRIPTION OF THE DRAWINGS

Other and further objects, features, and advantages of the invention will be more explicit from the following detailed description taken with reference to the drawings wherein:

FIG. 5 is a graph showing changes of ashing speed relative to the $CF_4$ gas addition ratio, when ashing the resist by filling the plasma etching device in FIG. 1 with a mixed gas atmosphere of $O_2$ gas and $CF_4$ gas;

DETAILED DESCRIPTION OF THE PREFERRED EMBODIMENTS

Figure 1:
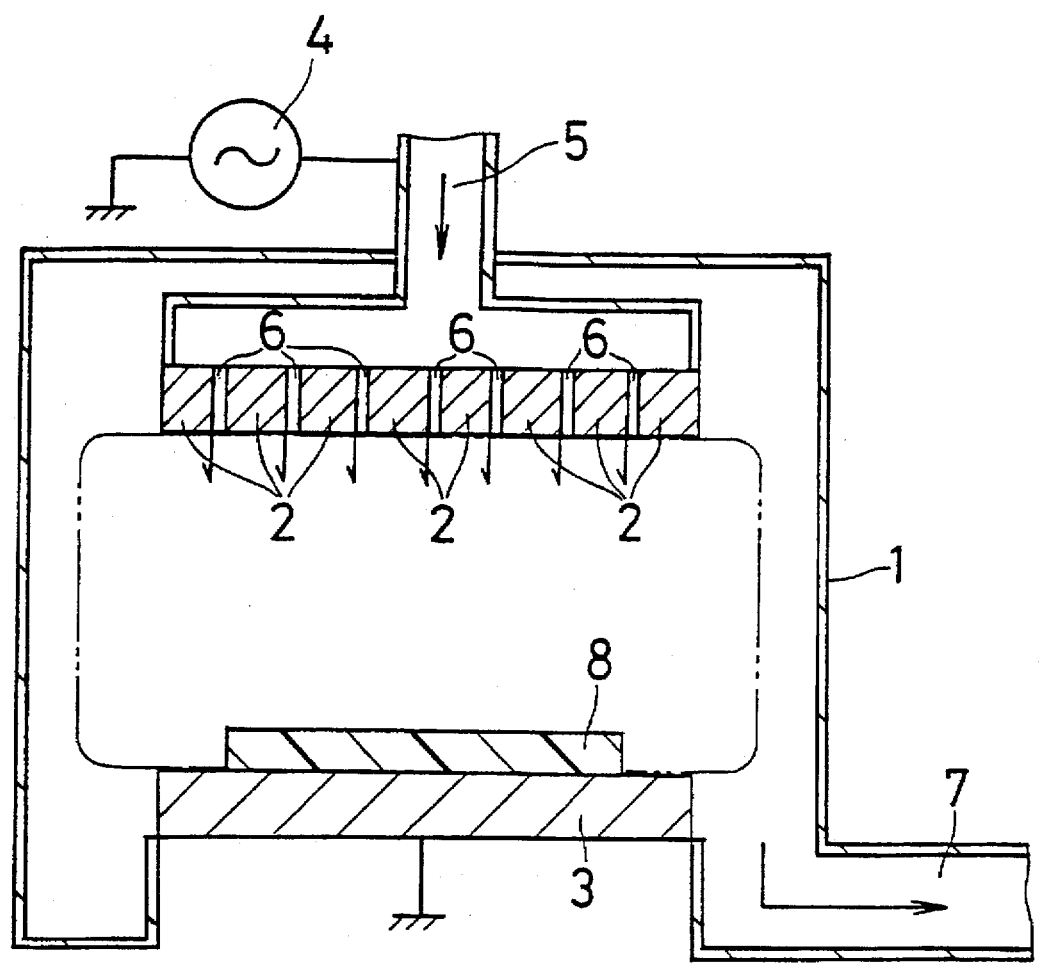
FIG. 1 is a schematic sectional view of a parallel plate electrode type plasma etching device to which the invention is applied.

Now referring to the drawings, preferred embodiments of the invention are described below.

FIG. 1 is a schematic sectional view of a parallel plate electrode type plasma etching device to which the invention is applied. Inside a reactor 1, a pair of plate electrodes, an upper electrode 2 and a lower electrode 3, are disposed parallel to each other. The reactor 1 and the electrodes 2, 3 are insulated. A high frequency power source 4 is connected to the upper electrode 2. The lower electrode 3 is grounded.

The mixed gas for forming plasma is introduced into the reactor 1 through a gas feed tube 5 by way of a gas feed hole 6 provided in the upper electrode 2. The exhaust gas generated in the reactor 1 and containing reaction products of plasma and the resist are exhausted outside the reactor 1 from a gas exhaust tube 7. The gas exhaust tube 7 is provided with exhaust valves and a vacuum pump, which are not shown, and the pressure in the reactor 1 is kept constant.

A substrate 8 to be treated which is coated with the resist is placed on the lower electrode 3. In the lower electrode 3, a heating medium such as ethylene glycol and silicone oil is circulating, and the temperature of the heating medium is controlled by temperature control means. Hence, the temperature in the lower electrode 3 is kept constant. The temperature of the substrate 8 to be treated placed on the lower electrode 3 is kept at a temperature in a range not causing oxidation or thermal damage to the film material other than the resist formed on the substrate 8, for example, 40° to 120° C.

In the ashing process, after placing the substrate 8 on the lower electrode 3, the reactor 1 is evacuated to a desired degree of vacuum, and $SF_6$ gas and $O_2$ gas are led into the reactor 1 at a predetermined flow rate through the gas feed tube 5 and gas feed hole 6. $SF_6$ gas is one of the gases conventionally used in dry etching method as the gas to be added to $O_2$ gas, and has lower toxicity as compared with other gases, and is hence easy to handle. Next, the inside of the reactor 1 is kept at a predetermined pressure, and a predetermined high frequency electric power is applied to the upper electrode 2. As a result, a high frequency electric field is applied to the decompressed mixed gas to cause an electric discharge, and plasma of mixed gas is generated. The resist applied on the substrate 8 induces a chemical reaction with active ions and others contained in the plasma. Accordingly, the resist becomes a reaction product of volatile substance such as $H_2O$, $CO_2$, and CO, for example, and is exhausted outside the reactor 1 through the gas exhaust tube 7.

Figure 2:
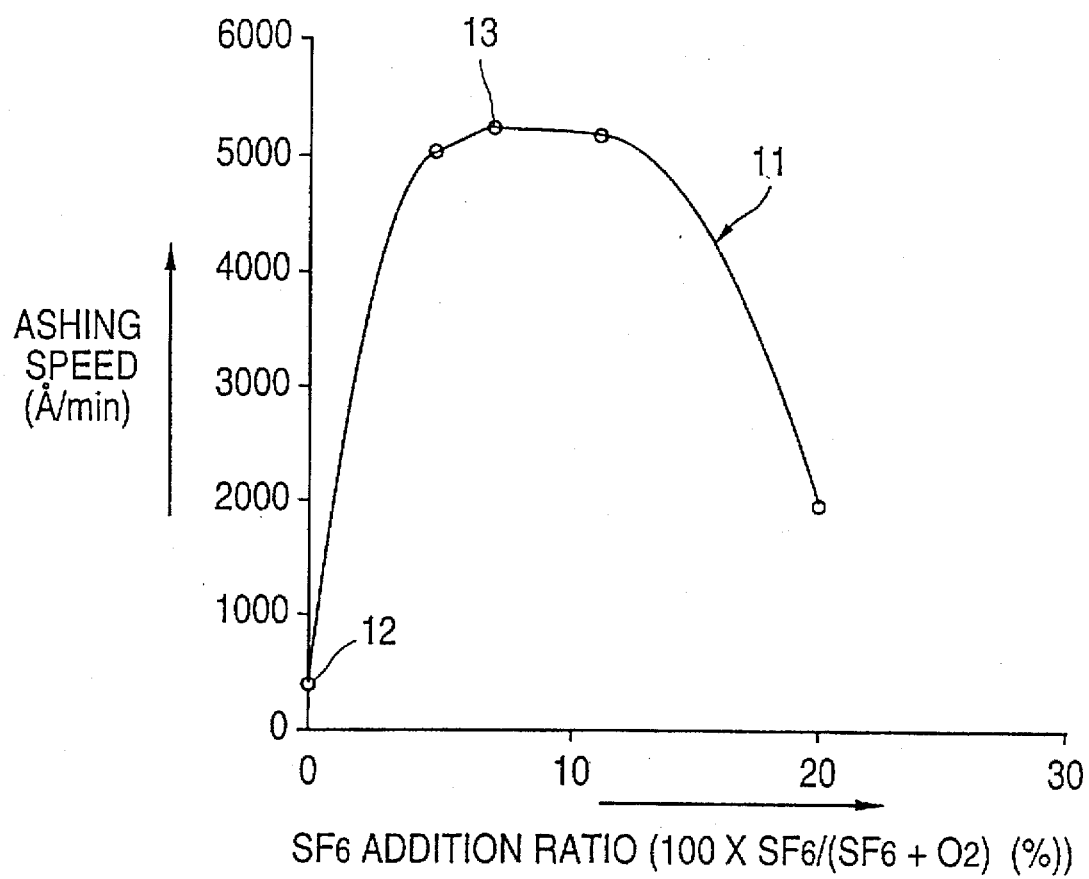
FIG. 2 is a graph showing changes of ashing speed relative to the $SF_6$ gas addition ratio, when ashing the resist by filling the plasma etching device in FIG. 1 with a mixed gas atmosphere of $O_2$ gas and $SF_6$ gas.

FIG. 2 is a graph showing the relation between the addition ratio of $SF_6$ gas to the whole volume of mixed gas and the ashing speed, when ashing the resist by using a mixed gas of $SF_6$ gas and $O_2$ gas, in the plasma etching device in FIG. 1. This resist material is novolak resin. This ashing process was conducted in the following conditions: pressure in the reactor 1 of 500 mTorr, frequency of high frequency power source of 13.56 MHz, electric power of high frequency power source of 0.10 w/cm² per unit area of upper electrode 2, and temperature of the lower electrode 3 of 60° C. This ashing speed is the mean value of the ashing speed to the resist in each region of the substrate divided into smaller divisions, when ashing the resist formed on a rectangular glass substrate of 360 mm×465 mm in the above condition.

As indicated by solid line 11, the ashing speed increases suddenly when the $SF_6$ gas addition ratio increases from 0 vol. % to 5 vol. %, and reaches the maximum value at near the addition ratio of $SF_6$ gas of 7.0 vol. %. When $SF_6$ gas is added more than 7.0 vol. %, the ashing speed drops gradually, and when the $SF_6$ gas addition ratio exceeds 15 vol. %, the ashing speed drops suddenly. When the $SF_6$ gas addition ratio is 5 vol. %, the ashing speed is 5000 angstroms/min. At the $SF_6$ gas addition ratio of 15 vol. %, the ashing speed is 4400 angstroms/min.

In the manufacturing process of substrates used in liquid crystal display device or the like, the uniformity of ashing speed in a single substrate must be kept within ±10%. When the $SF_6$ gas addition ratio in the mixed gas is in a range of 5 vol. % to 15 vol. %, each ashing speed against the resist in each region by dividing the single substrate into smaller divisions is included in a range of within ±10% with respect to about the mean value of their ashing speeds. Hence, the ashing process using the mixed gas of $SF_6$ gas and $O_2$ gas of which $SF_6$ gas addition ratio is within 5 vol. % to 15 vol. % can be applied in the manufacturing line of substrates.

The ashing speed when the addition ratio of $SF_6$ gas is 7.0 vol. % indicated by point 13 is 5200 angstroms/min. The ashing speed when the addition ratio of $SF_6$ gas is 0 vol. % indicated by point 12 is 400 angstroms/min. Therefore, when the addition ratio of $SF_6$ gas is 7.0 vol. %, the ashing speed is about 12 times faster than in the case of using $O_2$ gas alone, and it is known to be the best conditions. When the addition ratio of $SF_6$ gas is 7.0 vol. %, the $SF_6$ gas flow rate is 30 sccm, and the flow rate of $O_2$ gas is 400 sccm.

Figure 3:
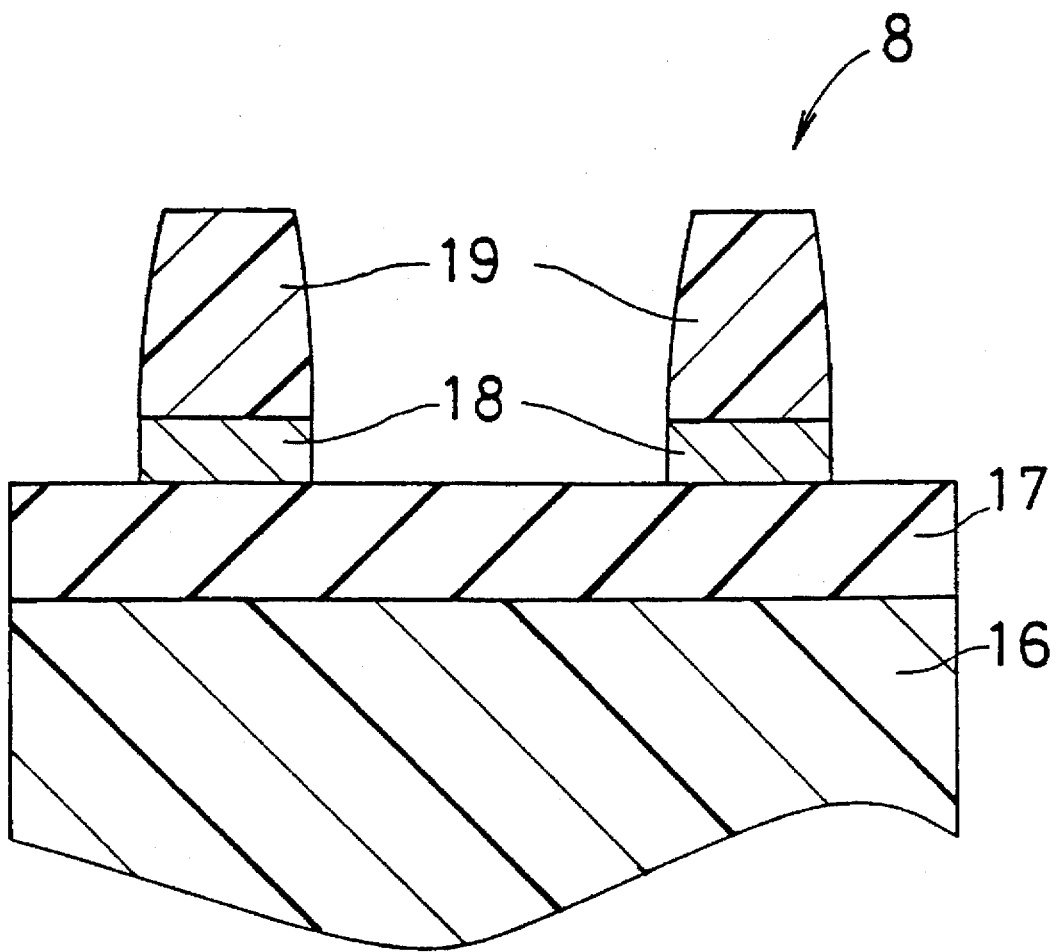
FIG. 3 is a simplified sectional view showing the structure of a substrate to be treated 8.

In the mixed gas atmosphere of $O_2$ gas and $SF_6$ gas in which the addition ratio of $SF_6$ was 7.0 vol. %, the substrate 8 to be treated was ashed by using the device in FIG. 1. FIG. 3 is a simplified sectional view of the substrate 8 to be treated. The treated substrate 8 has a structure having a 2000-angstrom thick $SiO_2$ film 17 on an insulating substrate 16, and an etched 1000-angstrom thick Si film 18 and 7000-angstrom thick resist film 19 thereon. The material of the resist film 19 is, for example, novolak resin. Etching of the Si film 18 is conducted by dry etching method using a fluorocarbon gas such as $CF_4$ and CHF3, or a mixed gas of $SF_6$ and $O_2$.

When etching the Si film 18 by the dry etching method using a mixed gas of $SF_6$ and $O_2$, the $SF_6$ gas flow rate was 200 sccm, and the $O_2$ gas flow rate was 50 sccm. The electric power of high frequency power source was 1.0 W/cm², and the pressure in the reactor 1 was 250 mTorr.

The resist 19 of the substrate 8 was ashed in the same ashing conditions (such as the pressure in the reactor 1 and frequency), as those in measurement in FIG. 2, in the presence of a mixed gas atmosphere with the addition ratio of $SF_6$ of 7.0 vol. %. As a result, the resist film 19 could be completely removed in 100 seconds. When the substrate of similar constitution was ashed by $O_2$ gas alone, the resist could be completely removed in 1,300 seconds. Therefore, the ashing process by using the mixed gas of $SF_6$ addition ratio of 7.0 vol. % enables ashing to be conducted in a time shorter than an ashing time by the process employing $O_2$ gas alone.

Incidentally, ashing for removing the resist and etching for processing $SiO_2$ film 17 and Si film 18 are carried out by using a similar device with a similar mixed gas. Accordingly, it is considered that the $SiO_2$ film 17 or the like may be etched during the ashing process. Hence, in the same mixed gas and same conditions, it is required that the ashing speed of ashing of resist must be sufficiently greater than the etching speed of etching of $SiO_2$ film and the like.

The ratio of ashing amount of resist per unit time and etching amount of $SiO_2$ film or Si film per unit time, by the mixed gas with $SF_6$ addition ratio of 7.0 vol. % is 1/500 or less in both $SiO_2$ film and Si film. Hence, while the resist is completely ashed, the $SiO_2$ film or Si film in the region not coated with resist is hardly etched. Therefore, during the ashing process using the mixed gas with $SF_6$ addition ratio of 7.0 vol. %, the $SiO_2$ film and Si film may be rarely etched and damaged significantly. Hence, there is almost no effect on the semiconductor elements to be manufactured.

Besides, as compared with the etching speed of etching the films of aluminum, titanium, chromium, tantalum, $Si_3N_4$, and $Ta_2O_5$, by the mixed gas with $SF_6$ addition ratio of 7.0 vol. %, the ashing speed of ashing the resist by the mixed gas with $SF_6$ addition ratio of 7.0 vol. % is more than 80 times faster. Hence, the films may be hardly damaged in the ashing process, same as in the case of $SiO_2$ film and Si film.

Moreover, in this embodiment, the electric power of the high frequency power source must be selected at 0.10 W/cm² per unit area of electrode. In the case of ashing process by plasma of $O_2$ alone, the electric power of the high frequency power source must be selected over 2.0 W/cm² per unit area of electrode, in order to obtain the same ashing speed as in the embodiment. In this embodiment, therefore, as compared with the ashing process at the same ashing speed by the plasma of $O_2$ gas alone, the electric power of the high frequency power source is known to be a low output. Hence, the number of high energy charged particles contained in the plasma is decreased. Therefore, the substrate is prevented from being damaged by the charged particles during the ashing process.

Figure 4:
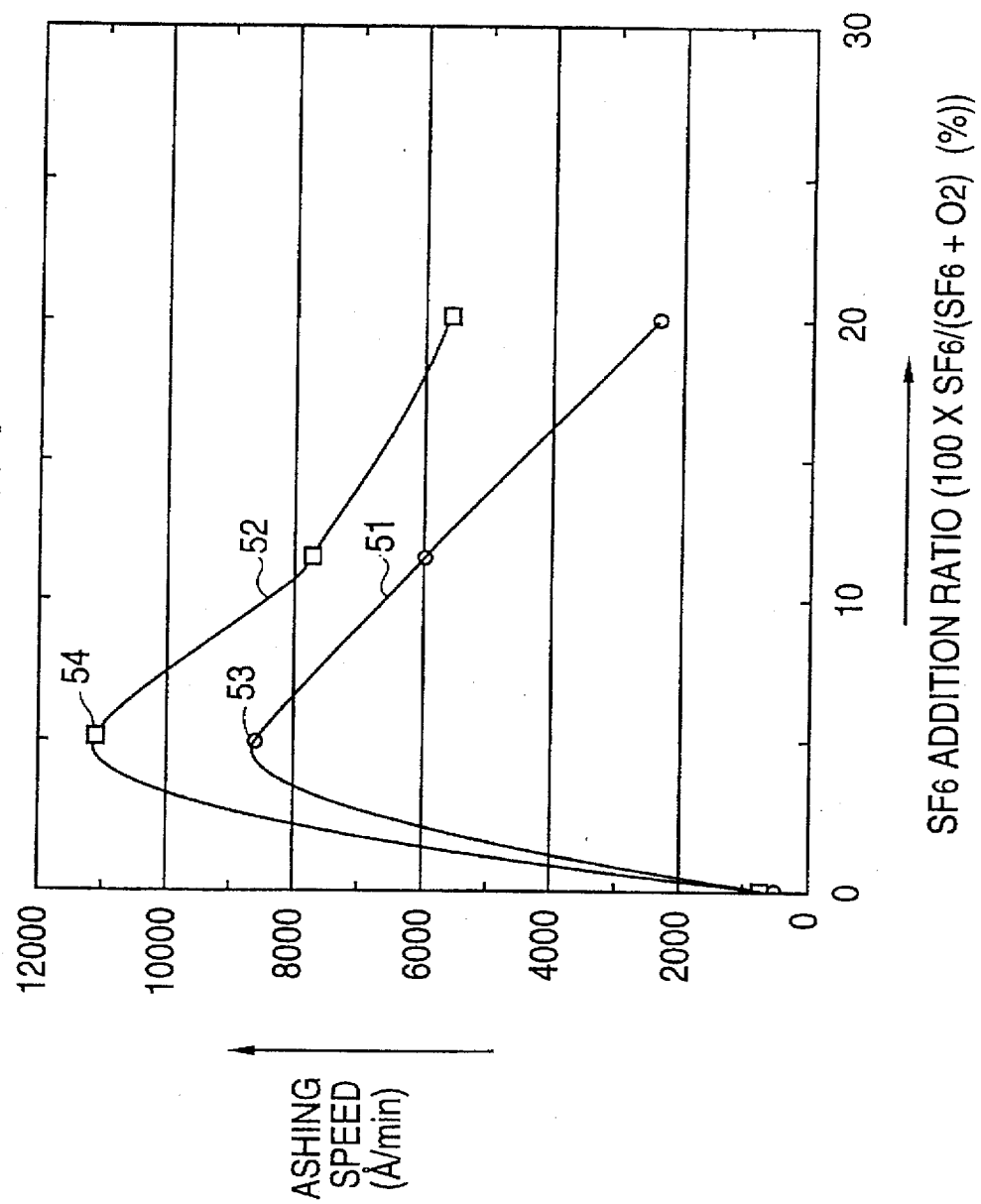
FIG. 4 is a graph showing changes of ashing speed relative to $SF_6$ gas addition ratio and high frequency electric power, when ashing the resist by filling the plasma etching device in FIG. 1 with a mixed gas atmosphere of $O_2$ gas and $SF_6$ gas.

FIG. 4 is a graph showing the relation of the $SF_6$ gas addition ratio in the mixed gas, ashing speed, and high frequency electric power, when ashing the resist by using a mixed gas of $SF_6$ gas and $O_2$ gas in the plasma etching device in FIG. 1. The ashed resist material is novolak resin. At this time, the ashing process shown by curves 51, 52 was conducted in the following conditions: pressure in the reactor 1 of 500 mTorr, frequency of high frequency power source of 13.56 MHz, and temperature of lower electrode 3 of 60° C.

Curve 51 shows the relation of the $SF_6$ addition ratio and ashing speed when the electric power of the high frequency power source is 0.20 w/cm$^2$ per unit area of the upper electrode 2. Curve 52 shows the relation of the $SF_6$ addition ratio and ashing speed when the electric power of the high frequency power source is 0.40 w/cm$^2$ per unit area of the upper electrode 2. When the high frequency electric power is 0.20 W/cm$^2$ and 0.40 W/cm$^2$, as indicated by curves 51 and 52, the ashing speed increases abruptly when the $SF_6$ addition ratio is increased from 0 vol. % to 5 vol. %, and reaches the maximum value when the $SF_6$ addition ratio is 5 vol. %. When the $SF_6$ addition ratio exceeds 5 vol. %, the ashing speed declines gradually.

When the high frequency electric power increases, the maximum value when the $SF_6$ addition ratio is 5 vol. % increases. The maximum value of the ashing speed when the high frequency electric power is 0.20 W/cm$^2$ is about 8500 angstroms/min at the $SF_6$ addition ratio of 5 vol. % as indicated by point 53. The maximum value of the ashing speed when the high frequency electric power is 0.40 W/cm$^2$ is about 11000 angstroms/min at the $SF_6$ addition ratio of 5 vol. % as indicated by point 54. Besides, as shown in FIG. 2, the maximum value of the ashing speed when the high frequency electric power is 0.10 W/cm$^2$ is about 5200 angstroms/min at the $SF_6$ addition ratio of 7.0 vol. %.

In this way, in the ashing process using the mixed gas of $SF_6$ gas and $O_2$ gas, when the $SF_6$ addition ratio is equal, the ashing speed is higher as the high frequency electric power applied to the upper electrode 2 is increased. Likewise, in the case of the ashing process under the conditions indicated by curves 51, 52, as compared with the case of using plasma of $O_2$ gas alone, the required electric power of the high frequency power source is sufficiently lower, and the ashing speed is faster.

Using other mixed gas, herein, the relation between the addition ratio and ashing speed in the ashing process is shown. FIG. 5 is a graph showing the relation of $CF_4$ gas addition ratio in mixed gas and the ashing speed, in the case of ashing of the resist by using mixed gas of $CF_4$ gas and $O_2$ gas in the plasma etching device in FIG. 1. The ashed resist material is novolak resin. At this time, the ashing process was conducted in the following conditions: $O_2$ gas flow rate of 400 sccm, pressure in the reactor 1 of 500 mTorr, frequency of high frequency power source of 13.56 MHz, electric power of 0.10 W/cm$^2$ per unit area of upper electrode 2, and temperature of lower electrode 3 of 60° C.

As indicated by curve 55, the ashing speed increases linearly in proportion to the increase of $CF_4$ addition ratio. The ashing speed when the $CF_4$ addition ratio is 20 vol. % is 2000 angstroms/min as indicated by point Hence, the ashing speed in the ashing process using the mixed gas of $CF_4$ gas and $O_2$ gas is lower than the ashing speed by using the mixed gas of $SF_6$ gas and $O_2$ gas.

When using the mixed gas of $CF_4$ gas and $O_2$ gas, to increase the ashing speed, the addition ratio of $CF_4$ gas must be increased. In the mixed gas of $SF_6$ gas and $O_2$ gas, to raise the ashing speed to the maximum, the addition ratio of $SF_6$ gas may be at least 5 vol. % to 15 vol. %. Therefore, when using the mixed gas of $SF_6$ gas and $O_2$ gas, only by slightly adding the $SF_6$ gas, the ashing speed can be raised to the maximum.

The resist material used in the embodiment is novolak resin, polymethyl methacrylate, polyvinyl cinnamate, or the like. If the resist material is a hydrocarbon polymer which reacts with oxygen plasma to form volatile substance such as $CO_2$, $CO$ and $H_2O$, similar effects are obtained as in the case where the resist made of the foregoing materials is subjected to ashing under the conditions mentioned above, including the relation of the ashing speed and the $SF_6$ addition ratio in a mixed gas.

In the embodiment, the parallel plate electrode type plasma etching device is used, but the RIE (reactive ion etching) type or barrel type plasma etching device may be also used.

Figure 6A:
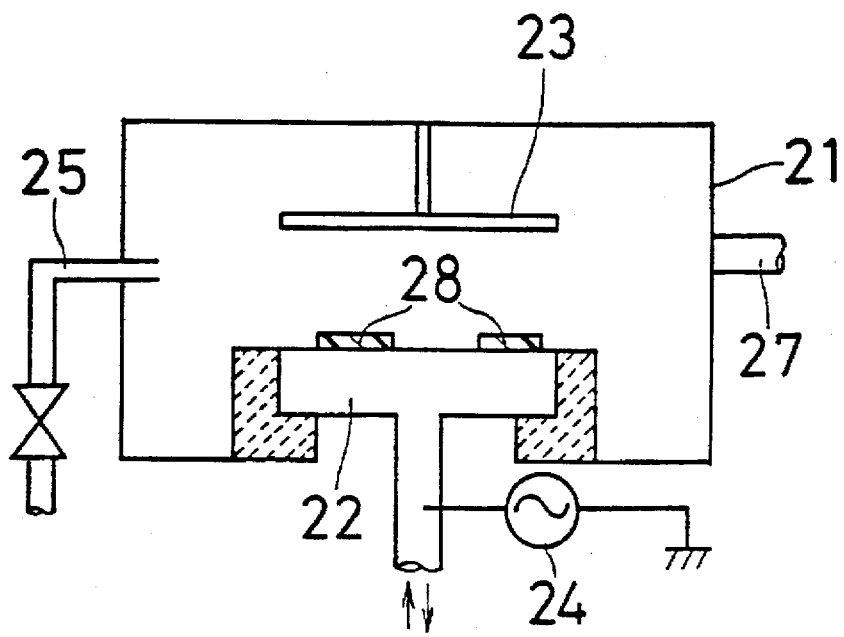
FIGS. 6A and B are schematic sectional views of RIE type plasma etching device.

FIG. 6A is a schematic sectional view of RIE type plasma etching device. On a parallel electrode 22 provided in a reactor 21 and connected with a high frequency power source 24, a substrate 28 coated with resist is placed. A mixed gas is introduced into the reactor 21 through a gas feed tube 25. By an exhaust valve or the like, not shown in the figure, interposed in an exhaust tube 27, the pressure in the reactor 21 is kept constant. A high frequency electric power is applied to the parallel electrode 22, and electric discharge is caused in the mixed gas existing between the parallel electrode 22 and its confronting counter electrode 23.

Figure 6B:
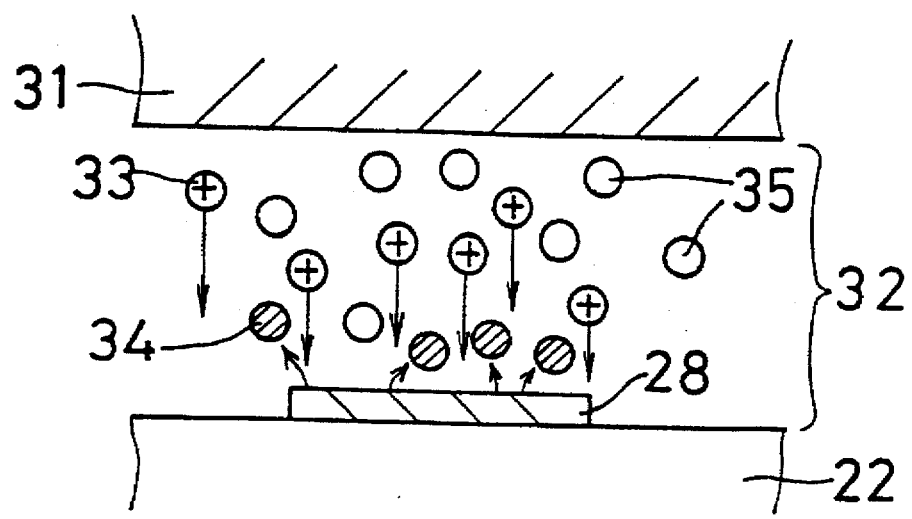

At this time, due to a great difference in the mobility of electrons and ions, a cathode fall region 32 is generated on the surface of the parallel electrode 22. In the cathode fall region 32, active ions 33 enter along a vertical electric field on the surface of the parallel electrode 22 and substrate 28 to be treated, and react with the resist on the surface of the substrate 28. The reaction product 34 evaporates as gas. As a result, a reactive ashing progresses. FIG. 6B is a schematic diagram for explaining the phenomenon on the surface of the substrate 28 to be treated, and a shaded region 31 shows a plasma generation region between the parallel electrode 22 and counter electrode 23, and white spots 35 indicate neutral gas molecules.

Figure 7A:
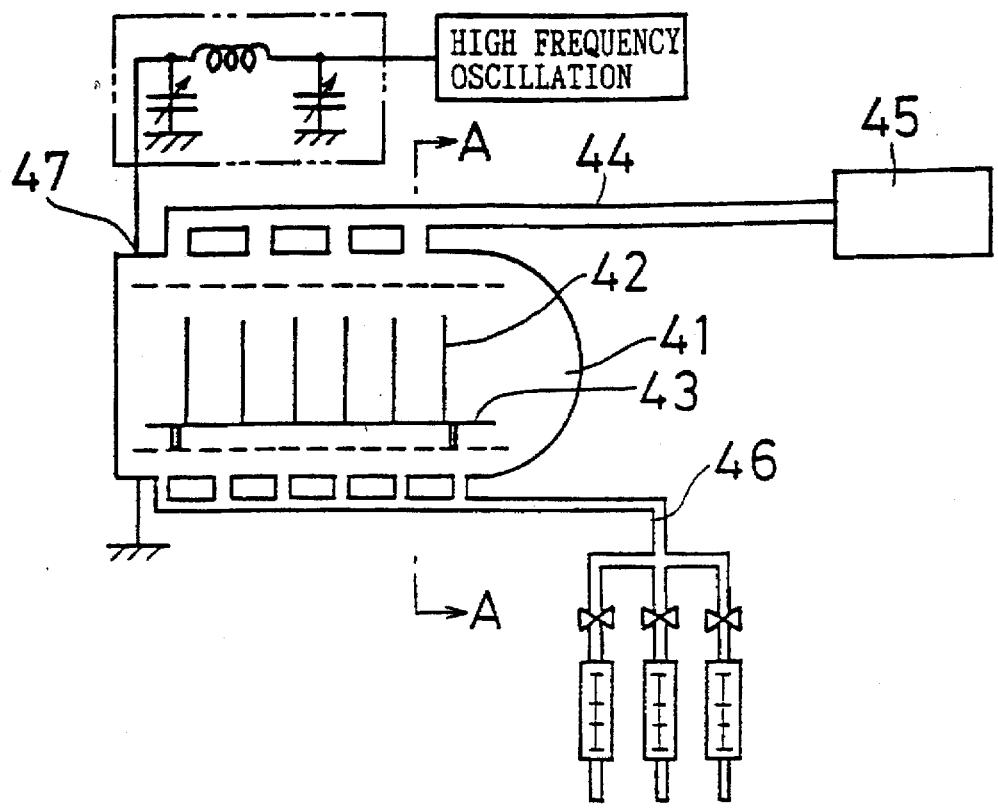
FIGS. 7A and B are schematic sectional views of barrel type plasma etching device.
Figure 7B:
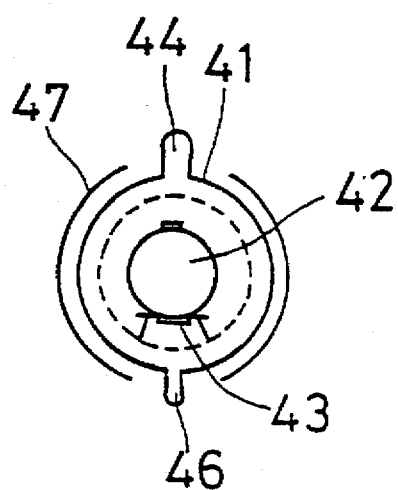

FIG. 7A is a schematic sectional diagram of barrel type plasma etching device. FIG. 7B is a sectional view A—A of the etching device in FIG. 7A. In a cylindrical reactor 41, a substrate 42 preheated to a specific temperature is inserted on a holder 43. Then the reactor 41 is evacuated by a vacuum pump 45 connected with the reactor 41 through an exhaust tube 44. When reaching a desired degree of vacuum, a mixed gas is fed into the reactor 41 through gas feed means 46. When the degree of vacuum becomes stable, a high frequency of, for example, 13.56 MHz is applied to an arc-shaped electrode 47, and a plasma is generated in the reactor 41. As the plasma is generated, activated gas reacts with the resist of the substrate 42 to be treated, and forms a reaction product of volatile substance. The reaction product is exhausted as exhaust gas. When ashing process is over, electric discharge is stopped, and the remaining gas is removed, and nitrogen gas or the like is introduced, and the pressure in the reactor 41 is returned to the atmospheric pressure, and then the substrate 42 is taken out.

Using the plasma etching devices of these types, when the ashing process was conducted by using the mixed gas of $SF_6$ gas and $O_2$ gas, similar as in the ashing process by using the parallel plate electrode plasma etching device in FIG. 1, similar effects as in the plasma etching device in FIG. 1 were obtained. At this time, the $SF_6$ addition ratio, pressure in reactor, and electric power of high frequency power source were the same as those in the case of using the parallel plate electrode type plasma etching device in FIG. 1. The temperature of the substrate to be treated is kept at 40° to 120° C. In the barrel type plasma etching device, since the substrate cannot be heated in the device, the substrate is preliminarily heated to a specific temperature, and then inserted.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of ashing a resist comprising the steps of:
   placing a substrate, coated with the resist, to be treated in a mixed gas atmosphere, said mixed gas atmosphere containing $SF_6$ gas and $O_2$ gas with the concentration of the $SF_6$ gas in the mixed gas being selected to be 7.0 vol. %;
   generating plasma of the mixed gas; and
   subjecting the resist to the plasma,
   whereby the resist is ashed.

2. The method of ashing a resist according to claim 1, wherein the substrate to be treated is mounted on a first electrode provided inside a reactor, the mixed gas is introduced into the reactor and the internal pressure of the reactor is maintained at 500 mTorr, the first electrode is heated at 60° C., the high frequency electric power having a frequency of 13.56 MHz and power per unit area of 0.10 W/cm$^2$ is applied to a second electrode which faces the first electrode at least with the substrate to be treated between in order for discharge to occur, and the mixed gas is ionized by the discharge to form plasma.

3. An apparatus for ashing a resist wherein the resist to be treated coats a substrate and is ashed by plasma, said apparatus comprising:
   a first planar electrode on which the substrate to be treated is mounted;
   a second planar electrode disposed at the substrate-mounting surface side of the first electrode, the second electrode opposing the first electrode;
   power supplying means for supplying the first electrode and the second electrode with predetermined power;
   heating means for heating the substrate to be treated which is mounted on the first electrode;
   a reactor for containing and sealing at least the first electrode, the second electrode and the substrate to be treated; and
   reacting-gas supplying means for supplying the reactor with a mixed gas which contains $O_2$ gas and $SF_6$ gas with the concentration of the $SF_6$ gas in the mixed gas being selected to be 7.0 vol. %.

* * * * *